(12) United States Patent
Abarbanel et al.

(10) Patent No.: US 6,310,906 B1
(45) Date of Patent: Oct. 30, 2001

(54) CHAOTIC CARRIER PULSE POSITION MODULATION COMMUNICATION SYSTEM AND METHOD

(75) Inventors: Henry D. I. Abarbanel; Lawrence E. Larson, both of Del Mar; Nikolai F. Rulkov, San Diego; Mikhail M. Sushchik, San Diego; Lev S. Tsimring, San Diego; Alexander R. Volkovskii, San Diego, all of CA (US)

(73) Assignee: The Regents of the University of California, Oakland, CA (US)

(*) Notice: Subject to any disclaimer, the term of this patent is extended or adjusted under 35 U.S.C. 154(b) by 0 days.

(21) Appl. No.: 09/376,440

(22) Filed: Aug. 18, 1999

(51) Int. Cl.$^7$ .................................................. H04B 1/69
(52) U.S. Cl. ......................... 375/130; 375/239; 329/313; 332/112
(58) Field of Search ..................... 375/239, 130; 380/262, 274, 46; 329/313; 332/112

(56) References Cited

U.S. PATENT DOCUMENTS

| | | |
|---|---|---|
| 5,245,660 | 9/1993 | Pecora et al. . |
| 5,321,409 * | 6/1994 | Walker ................................ 342/202 |
| 5,379,346 | 1/1995 | Pecora et al. . |
| 5,729,607 * | 3/1998 | DeFries et al. .......................... 380/6 |
| 5,923,760 * | 7/1999 | Abarbanel et al. .................... 380/34 |
| 6,011,506 * | 1/2000 | Li ......................................... 342/54 |

OTHER PUBLICATIONS

M.Z. Win, R.A. Scholtz, "Impulse Radio: How it Works", *IEEE Communications Letters*, vol. 2, No. 2, Feb. 1998, pp. 36–38.

C.W. Wu, L.O. Chua, "A Simple Way to Synchronize Chaotic Systems with Applications to Secure Communication Systems", *International Journal of Bifurcation and Chaos*, vol. 3, No. 6, 1993, pp. 1619–1627.

H. Torikai, T. Saito, W. Schwarz, "Multiplex Communication Scheme Based on Synchronization via Multiplex Pulse–Trains", in *Proceedings of the 1998 IEEE International Symposium on Circuits and Systems*, NY, 1998, pp. 554–557.

A.R. Volkovskii, N.F. Rul'kov, "Synchronous Chaotic Response of a Nonlinear Oscillator System as a Principle for the Detection of the Information Component of Chaos", *Sov. Tech. Phys. Lett.*, vol. 19, No. 2, 1993, pp. 97–99.

(List continued on next page.)

Primary Examiner—Don N. Vo
(74) Attorney, Agent, or Firm—Greer, Burns & Crain, Ltd.

(57) ABSTRACT

A chaotic carrier pulse position modulation communication system and method is disclosed. The system includes a transmitter and receiver having matched chaotic pulse regenerators. The chaotic pulse regenerator in the receiver produces a synchronized replica of a chaotic pulse train generated by the regenerator in the transmitter. The pulse train from the transmitter can therefore act as a carrier signal. Data is encoded by the transmitter through selectively altering the interpulse timing between pulses in the chaotic pulse train. The altered pulse train is transmitted as a pulse signal. The receiver can detect whether a particular interpulse interval in the pulse signal has been altered by reference to the synchronized replica it generates, and can therefore detect the data transmitted by the receiver. Preferably, the receiver predicts the earliest moment in time it can expect a next pulse after observation of at least two consecutive pulses. It then decodes the pulse signal beginning at a short time before expected arrival of a pulse.

12 Claims, 7 Drawing Sheets

OTHER PUBLICATIONS

"Digital Communication Devices Based on Nonliner Dynamics and Chaos", presented at MURI Annual Review Meeting, UCLA May 24–25, 1999.

N.F. Rul'kov, A.R. Volkovskii, "Synchronized Chaos in Electronic Circuits", *SPIE Chaos in Communications*, vol. 2038, 1993, pp. 132–140.

L.M. Pecora, T.L. Carroll, "Synchronization in Chaotic Systems", *Physical Review Letters*, vol. 64, No. 8, Feb. 19, 1990, pp. 821–824.

M. Hasler, "Synchronization of Chaotic Systems and Transmission of Information", *International Journal for Bifurcation and Chaos*, vol. 8, No. 4, 1998, pp. 647–659.

T.L. Carroll, L.M. Pecora, "Cascading Synchronized Chaotic Systems", *Physica D*, vol. 67, 1993, pp. 126–140.

K.M. Cuomo and A.V. Oppenheim, "Circuit Implementation of Synchronized Chaos with Applications to Communications", *Physical Review Letters*, vol. 71, No. 1, Jul. 5, 1993, pp. 65–68.

L. Kocarev, K.S. Halle, K. Eckert, L.O. Chua, U. Parlitz, "Experimental Demonstration of Secure Communications via Chaotic Synchronization", *International Journal of Bifurcation and Chaos*, vol. 2, No. 3, 1992, pp. 709–713.

H. Dedieu, M.P. Kennedy, M. Hasler, "Chaos Shift Keying: Modulation and Demodulation of a Chaotic Carrier Using Self–Synchronizing Chua's Circuits", *IEEE Trans. on Circuits & Systems II*, vol. 40, No. 10, Oct. 1993, pp. 634–642.

K. Murali, M. Lakshmanan, "Transmission of Signals by Synchronization in a Chaotic Van der Pol–Duffing Oscillator", *Physical Review E*, vol. 48, No. 3, Sep. 1993, pp. R1624–1626.

K.S. Halle, C.W. Wu, M. Itoh, L.O. Chua, "Spread Spectrum Communication Through Modulation of Chaos", *International Journal of Bifurcation and Chaos*, vol. 3, No. 2, 1993, pp. 469–477.

D.R. Frey, "Chaotic Digital Encoding: An Approach to Secure Communication", *IEEE Transactions on Circuits and Systems II*, vol. 40, No. 10, Oct. 1993, pp. 660–666.

L. Kocarev, U. Parlitz, "General Approach for Chaotic Synchronization with Applications to Communications", *Physical Review Letters*, vol. 74, No. 25, Jun. 19, 1995, pp. 5028–5031.

U. Feldmann, M. Hasler, W. Schwarz, "Communication by Chaotic Signals: The Inverse System Approach", *International Journal of Circuit Theory and Applications*, vol. 24, 1996, pp. 551–579.

U. Parlitz, L. Kocarev. T. Stojanovski, H. Preckel, "Encoding Messages Using Chaotic Synchronization", *Physical Review E*, vol. 53, No. 5, May 1996, pp. 4351–4361.

\* cited by examiner

CHAOTIC CARRIER PULSE POSITION MODULATION COMMUNICATION SYSTEM AND METHOD

STATEMENT OF GOVERNMENT INTEREST

This invention was made with Government support under grant number DAAG55-98-1-0269 from the Army Research Office, and under grant number DE-FG03-90ER14138 from the Department of Energy, Office of Basic Energy Sciences. The Government has certain rights in this invention.

FIELD OF THE INVENTION

The present invention concerns the field of communications. The present invention is especially useful in wireless communication systems and methods, but will provide additional privacy and reduced power consumption in systems using a wired communication medium as well. The description herein is directed to a preferred wireless medium communication systems and is applicable to optical communications using lasers, but artisans will appreciate the general applicability of the invention to be inclusive of wired communication systems and systems using other communication media as well.

BACKGROUND OF THE INVENTION

The modem trend is toward increased reliance on data communication. Data communication is an essential feature, for example, in commerce conducted over computer networks. Where sensitive information is communicated in personal or business transactions, privacy from interception of the information is an important aspect of the communication system relied upon for transmission of the information. This is especially true in wireless communication systems because the communication medium used by the wireless system, i.e., the atmosphere, is readily accessible by parties who are not intended recipients of the information. Wireless phone networks are another example of data communication systems in which privacy of communication is valued. Point-to-multipoint data systems, such as a cellular subscription television system, where a broadcast is provided to paid subscribers, are an additional example. Many other such systems which could benefit from increased privacy and from reduced power consumption will be apparent to artisans.

In particular, there is a growing concern over the privacy of wireless communication systems. Wireless systems place additional demands on the components of the systems. Personal communication devices, such as cell phones, and computers and personal organizers with wireless communication capability, form a primary component of the wireless systems. As the devices become smaller and lighter, there is a strong need to reduce power consumption as the available battery power life is reduced when smaller batteries are used. In addition, reduced power consumption is generally desirable even when battery life is maintained or increased because reduced power consumption leads to a longer period of device operation without replacement or recharging of the battery used for power. Particular applications which benefit greatly from reduced power consumption are military applications since many devices in military communication systems depend upon portable power sources. Military applications also have a particular need for privacy from both detection of communications and decoding of information transmitted during communications. Law enforcement applications also particularly benefit from such privacy.

Chaotic dynamical systems have been proposed to address the problem of communication privacy. Chaotic signals exhibit a broad continuous spectrum and have been studied in connection with spread spectrum applications. The irregular nature of a chaotic signal makes it difficult to intercept and decode. In many instances a chaotic signal will be indistinguishable from noise and interference to receivers not having knowledge of the chaotic signal used for transmission. An important development in the use of chaotic systems was the ability to synchronize coupled chaotic systems to produce identical chaotic oscillations. See, *Synchronization in Chaotic Systems*, L. M. Pecora and T. L. Carroll, Phys. Rev. Lett., 64:821–824, 1990, *A Simple Way to Synchronize Chaotic Systems with Applications to Secure Communication Systems, Int'l* J. of Bifurcation and Chaos, 3(6):1619–1627, 1993, *Synchronized Chaos in Electronic Circuits*, N. F. Rul'kov and A. R. Volkovskii, from *Chaos in Communications*, edited by Louis M. Pecora, pp. 132–140, SPIE—The International Society for Optical Engineering, Bellingham, Wash., 98227–0010, 1993, all three of which are incorporated by reference herein.

Various chaos based communication systems have been proposed. A difficulty with chaos based communications is their extreme sensitivity to phase distortions due to their nonlinear nature. Many of the prior art systems are therefore very sensitive to distortions, filtering and noise. The negative effect of filtering limits the ability of these types of systems to rely on filtering to improve performance, and makes them more susceptible to distortions that naturally occur in communication channels.

Accordingly, there is a need for an improved communication system. In particular, there is a need for an improved chaos based communication system which has reduced sensitivity to distortions and noise. It is an object of the invention to provide such an improved chaos based communication system and method.

It is a further object of the invention to provide such an improved communication system with a low power consumption for transmission and reception of data.

SUMMARY OF THE INVENTION

Those needs and objects are met by the present invention, which is a chaotic carrier pulse position modulation communication system and method. Filtering and noise concerns are eliminated by the use of chaotically timed pulse sequences instead of continuous chaotic waveforms. Each pulse has the same shape, but the time delay between pulses varies chaotically. Chaotically varying the spacing between pulses enhances spectral characteristics of the communication system by removing any periodicity from the transmitted signal. The chance of an unauthorized reception is reduced compared to non-chaotic carriers because chaotically positioned pulses are difficult to observe and detect by spectral and correlation methods. Even if a communication could be detected it is difficult to decode because synchronization requires an ability to reproduce the chaotic carrier pulse train. Data is encoded by selectively altering interpulse intervals in the carrier pulse train, and all information is therefore contained solely in the timing of pulses in the chaotic carrier pulse train. Any conventional data coding scheme can be used in addition to further increase privacy.

The system of the invention includes a transmitter and receiver having matched chaotic pulse regenerators. Driven by the received pulse train, the regenerator in the receiver produces a synchronized replica of a chaotic pulse train generated by the transmission chaotic pulse regenerator. The pulse train from the transmitter can therefore act as a carrier signal. The transmitter selectively alters interpulse timing between pulses in the chaotic pulse train. The selectively altered pulse train is transmitted as a pulse signal. The receiver uses a chaotic synchronization method which can synchronize to the transmission pulse regenerator using the pulse signal despite the modulation in the pulse signal. Accordingly, the receiver can detect whether a particular interpulse interval in the pulse signal has been altered based upon the synchronized replica it generates, and can therefore detect the data transmitted by the receiver.

Preferably, the receiver predicts the earliest moment in time when it can expect a next pulse after observation of a sample of the pulse signal including at least two consecutive pulses. Use of a sample may require transmission of some synchronization data to begin communication with a receiver. The receiver then decodes the pulse signal in a time window beginning at a short time before expected arrival of a pulse. The windowing process is repeated around the expected arrival of a next pulse and so on. This reduces the chance that the receiver will improperly decode noise or interference as data. In addition, it aids signal multiplexing by reducing the chance that the receiver will improperly decode data belonging to two or more data streams as belonging to a single data stream. The windowing operation provides the basis for a design of a multiplexer that permits a single user to detect the message intended for it from the signal containing transmissions from multiple users.

In addition to privacy enhancement, the present invention provides reduced power consumption for transmission as well. Pulsed transmissions generally use less power than continuous transmissions for communication of a given data set.

BRIEF DESCRIPTION OF THE DRAWINGS

Other features, objects and advantages of the invention will be apparent to artisans by reference to the detailed description and drawings, of which:

FIG. 6 is a block diagram of an experimental system used to model and test the system of FIG. 1a;

DETAILED DESCRIPTION OF THE PREFERRED EMBODIMENTS

Broadly, the invention concerns a chaotic carrier pulse position modulation communication system and method. Data communication is accomplished through selectively modifying pulse positions in a chaotic pulse train to produce a pulse signal. The pulse signal is received by a receiver having the ability to generate a synchronized replica of the unmodulated chaotic pulse train, and is thereby able to detect whether or not a particular pulse position has been modified. Modification of a pulse position, or the lack thereof, indicates a data state sufficient to communicate information.

Figure 1A:
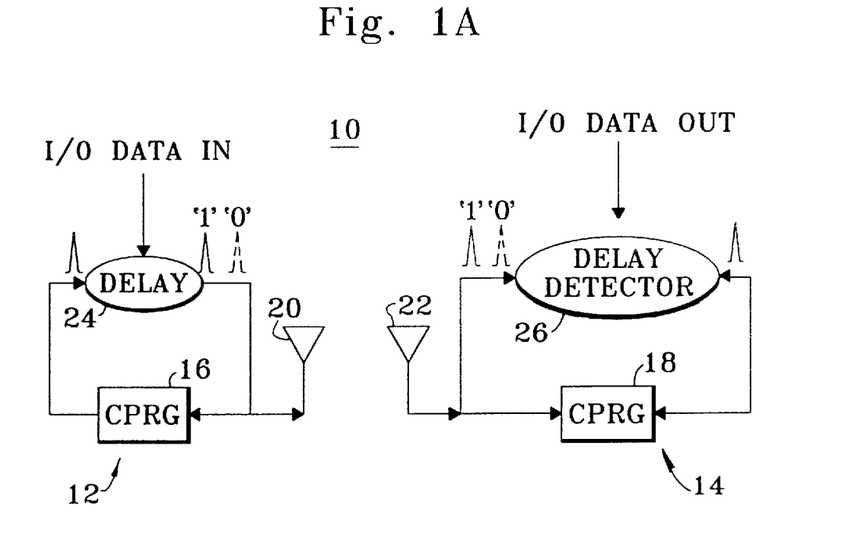
FIG. 1a is a block diagram of a chaotic carrier pulse position modulation system constructed in accordance with the present invention.

Referring now to FIG. 1a, shown is a block diagram of a preferred embodiment chaotic carrier pulse position modulation communication system 10 in accordance with the present invention. The preferred embodiment of the invention takes advantage of the dynamical feedback modulation method as set forth in "Synchronous Chaotic Response of a Nonlinear Oscillator System as a Principle for the Detection of the Information Component of Chaos Synchronization", Sov. Tech. Phys. Letters, 19:97–99 (1993), which is incorporated by reference herein. Other conventional schemes for chaotic regenerator synchronization are suitable and may alternatively be used to practice the invention. The conventional chaotic synchronization scheme must be able to synchronize despite modulation in the signal transmitted from the receiver to the transmitter. Specifically, a transmitter 12 and a receiver 14 in the system 10 have respective separate but matched chaotic pulse regenerators 16, 18 that are synchronized according to a conventional chaotic synchronization method.

The preferred embodiment system 10 is a wireless communication system with transmissions of a pulse signal radiating from a transmitter antenna 20 traveling in space to impinge upon a receiver antenna 22. In the illustrated embodiment, the antennas 20, 22 include conventional means to accomplish radiation transmission and reception. It is contemplated that the transmitter 12 and the receiver 14 may physically communicate via other conventional techniques and media, e.g., wired or fiber optic lines. The principles of the invention have also been demonstrated with optical communications through free space using a laser beam.

In the transmitter 12, the chaotic pulse regenerator 16 with feedback produces a chaotic pulse train having chaotically varying interpulse intervals. The pulse train serves as a carrier upon which the transmitter 12 transmits data. A data encoder, in the form of a delay circuit 24, modulates the carrier pulse train based upon data from a data source. In particular, the delay circuit 24 selectively alters interpulse intervals in the carrier pulse train from the chaotic pulse regenerator 16. With a pulse signal in the form of a modified pulse train with interpulse intervals $T_i$ as its input, for the n-th incoming pulse in this train, the chaotic pulse regenerator 16 produces at its output a new pulse after a delay time $\Delta T_n$. The delay time depends on the interpulse intervals of k previous input pulses: $\Delta T_n = F(T_n, \ldots, T_{n-k})$. $F(\bullet)$ is such that when chaotic pulse regenerator 16 output is applied directly to its input, forming a feedback loop, the chaotic pulse regenerator 16 generates a carrier pulse train with chaotic interpulse intervals. Information from a data source is applied to the pulse train by the delay circuit 24. To encode binary information, the delay circuit 24 selectively applies a single delay amount. N-ary data encoding may be achieved by a delay circuit which applies N-1 delay amounts.

In the preferred binary data embodiment, the delay circuit 24 selectively alters interpulse intervals by leaving the carrier pulse train unchanged if "0" is being transmitted or delays the pulse by a fixed time if "1" is being transmitted. This modified (modulated) pulse train is the transmitted pulse signal. Of course, the opposite encoding scheme is also contemplated, with a "0" causing a carrier pulse to be delayed and a "1" leaving a carrier pulse unchanged.

If an unauthorized receiver has no information on the chaotic spacing between the pulses leaving the transmission chaotic pulse regenerator 16, it cannot determine whether a particular received pulse was delayed, and thus whether "0" or "1" was transmitted. At the receiver 14, the pulse signal is applied to the input of the receiver chaotic pulse regenerator 18, which is matched to the transmission chaotic pulse regenerator 16. Thus, the signal at the output of the receiver chaotic pulse regenerator 18 is a synchronized replica of the pulse signal in the communication channel, between the transmitter 12 and receiver 14, except some pulses in the transmitted pulse signal are delayed by the information modulation. By evaluating the relative pulse timings in the received pulse signal and in the signal output by the receiver chaotic pulse regenerator 18, the receiver 14 can recover the transmitted data. A decoder, in the form of a delay detector 26, recovers the data from the pulse signal in this manner.

When the transmitter and receiver chaotic pulse regenerators 16, 18 are not matched with sufficient precision, they do not synchronize and a large decoding error results. This makes unauthorized or unintended reception and decoding of the pulse signal unlikely. In addition, it would be difficult for an unauthorized receiver to even detect the existence of a pulse signal transmitted from the transmitter 12 by spectral or correlation methods because the narrow chaotically spaced pulses that make up the pulse signal transmitted by the transmitter 12 lack periodicity. When synchronized, the receiver 14 knows the time interval or a window where it can expect apulse corresponding to "1" or "0". This allows the input to be blocked at all times except when a pulse is expected. The time intervals when the input to a particular receiver is blocked can be utilized by other users, thus providing a multiplexing strategy. Synchronization generally requires the receiver 14 to look at a sample of at least two consecutive pulses in the pulse signal. Thus, it may be preferable for the transmitter to transmit at least two, and maybe several, synchronization pulses to commence a communication with a receiver.

Figure 1B:
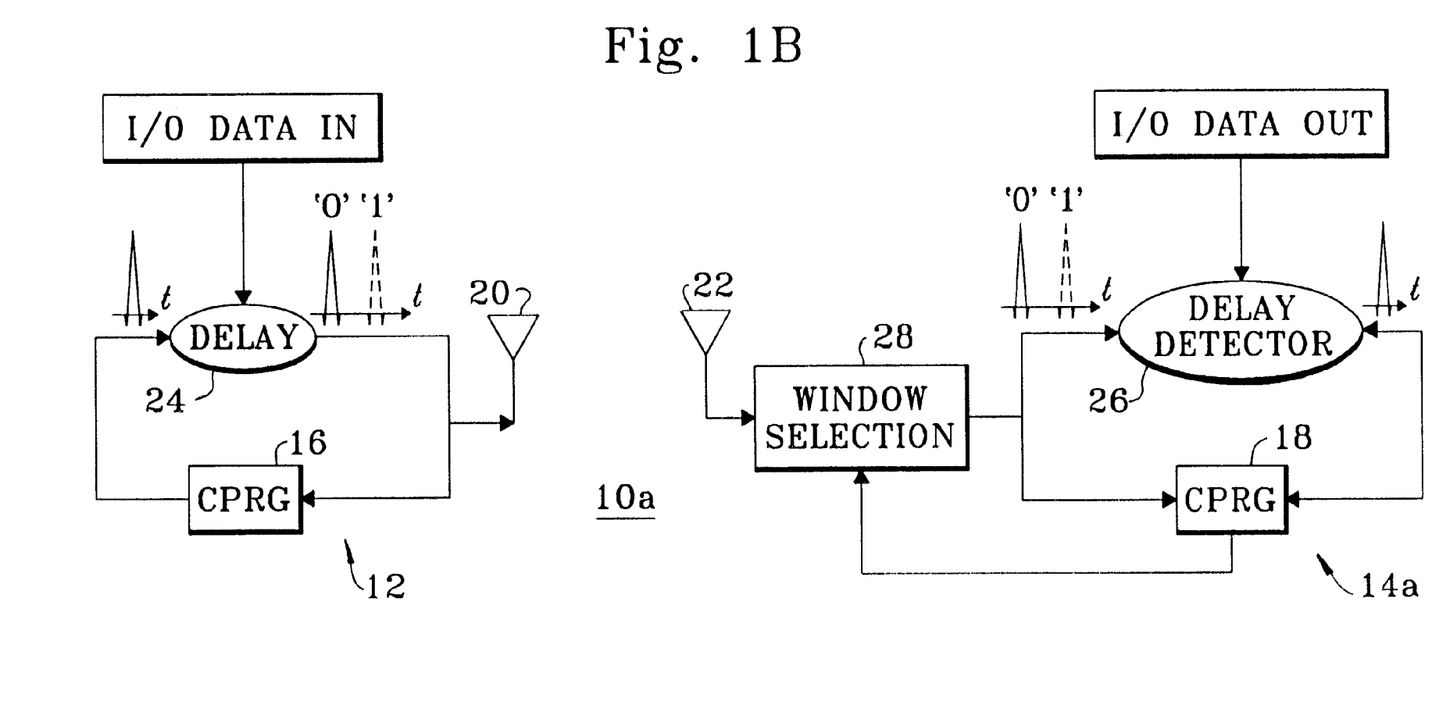
FIG. 1b is a block diagram of a modified chaotic carrier pulse position modulation system constructed in accordance with the present invention.

FIG. 1b shows a modified chaotic pulse position communication system 10a which accomplishes a windowing strategy that can be used to implement a multiplexing strategy, or simply can be used to improve performance. The system is identical to the system 10 in FIG. 1a, but the receiver 16 in system 10a includes a detection window control unit 28. The window control unit 28 allows the output of the antenna 22 to reach the decoder 26 only in small time windows where pulses are expected to arrive as determined with reference to the output of the receiver chaotic pulse regenerator 18. Whether or not the system 10a is used for multiplexing, it can improve decoding performance by eliminating some risk that noise could be interpreted as data.

Figure 2:
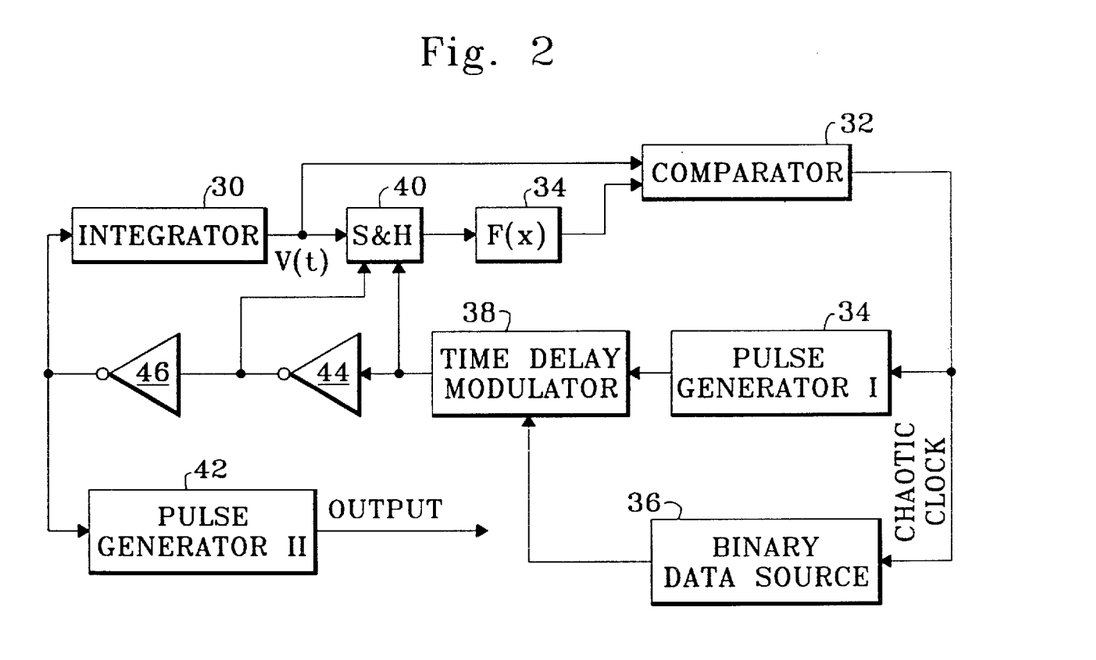
FIG. 2 is a block diagram of a preferred transmitter of the invention.

FIG. 2 illustrates a preferred transmitter of the invention. In FIG. 2, the chaotic pulse regenerator and data encoder components are integrated to form a single unit, but the transmitter is consistent in operational principle with the transmitter of FIGS. 1a and b. In FIG. 2, an integrator 30 produces a linearly increasing voltage, V(t), at its output. This voltage is compared by a comparator 32 with a threshold voltage produced at the output of a nonlinear converter 34 that produces threshold voltages according to a nonlinear function F(x). When voltage V(t) from integrator 30 reaches this threshold, the comparator triggers a pulse generator I 34, and causes a data source 36 to update the transmitted information bit. Depending on whether "1" or "0" is being transmitted, a delay modulator 38 does or does not delay the pulse produced by the pulse generator I 34. Through a sample and hold circuit (S&H) 40 the pulse from the time delay modulator 38 first resets the threshold to a new iteration value of the chaotic map x→F(x), and then resets output of the integrator 30 to zero. The position-modulated pulses are shaped in a pulse generator II 42 after being delayed through two invertors 44 and 46 and are transmitted to the receiver 14 through the antenna 20.

Figure 3A:
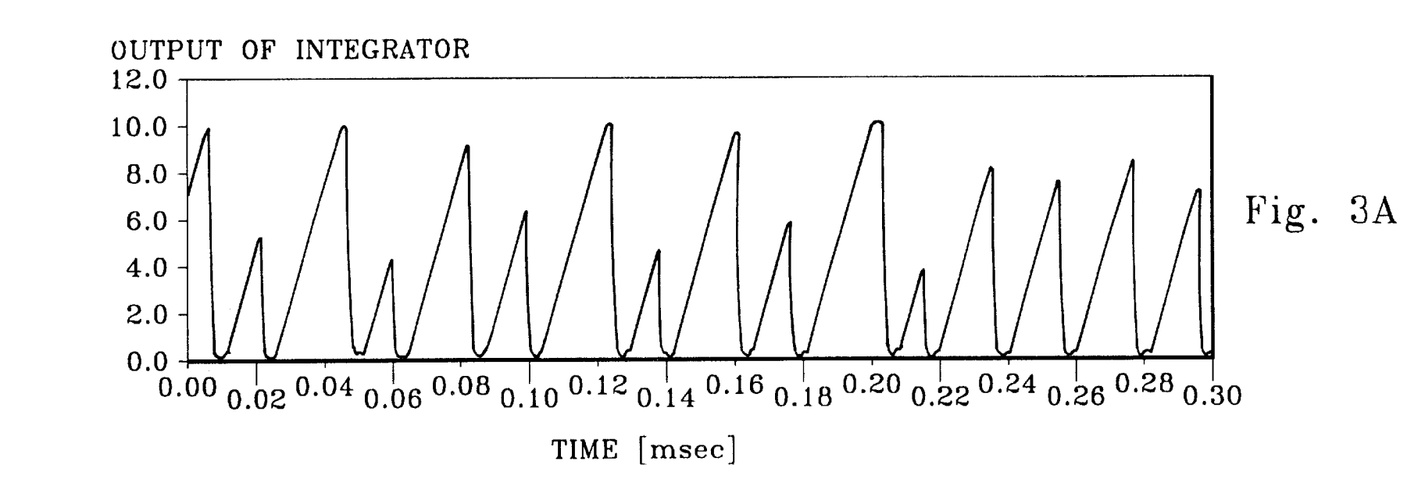
FIG. 3a is a voltage output map of an integrator in an experimental transmitter constructed according to FIG. 2.
Figure 3B:
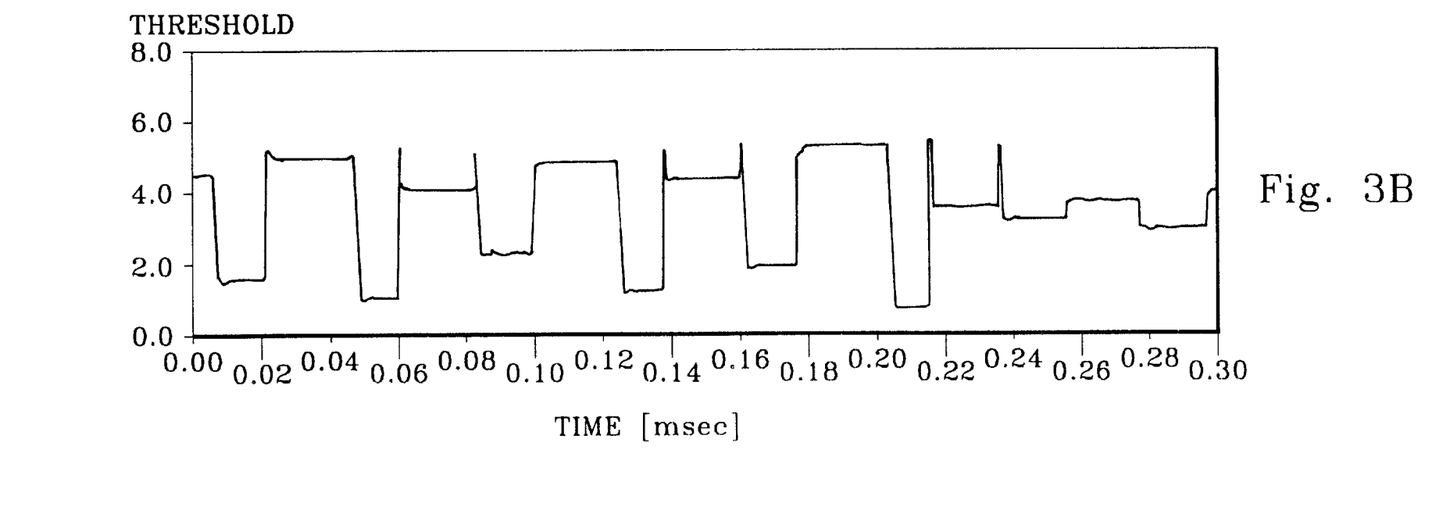
FIG. 3b is a voltage output map of a nonlinear converter from the experimental transmitter constructed according to FIG. 2.
Figure 3C:
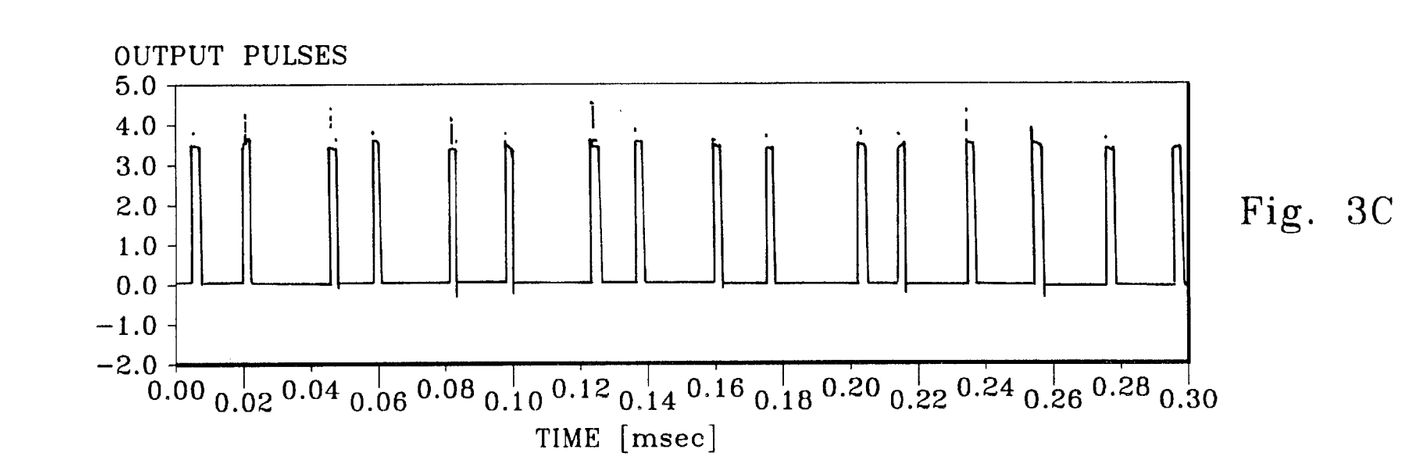
FIG. 3c is a voltage output map of a sample output pulse signal from the experimental transmitter constructed according to FIG. 2.
Figure 4:
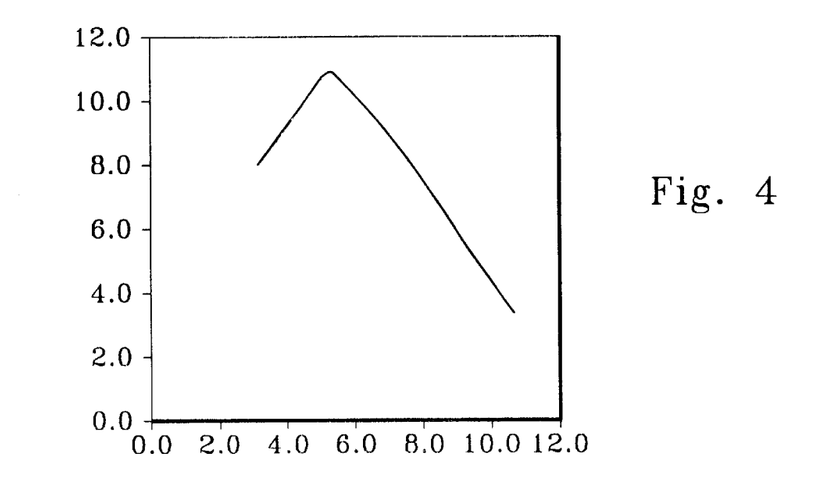
FIG. 4 is a plot showing the shape of a sample nonlinear function generated by the nonlinear converter in the experimental transmitter constructed according to FIG. 2.

An experimental transmitter modeling the FIG. 2 structure was constructed and tested. FIG. 3a maps the voltage at the output of the integrator in the experimental circuit. FIG. 3b maps the output at the nonlinear converter in the experimental circuit FIG. 3c maps a sample output pulse signal from the pulse generator II in the experimental circuit. The dynamics of the threshold is determined by the nonlinear function F(x). The spacing between the (n−1)-th and n-th pulses is proportional to the threshold value $x_n$, which is generated according to the map $x_{n+1}=F(x_n)+s_n$, where $s_n$ is the information signal. The shape of the nonlinear function generated by the corresponding circuit in the experimental transmitter is shown in FIG. 4

It is contemplated that each separate transmission system constructed in accordance with the invention, namely, a transmitter and its group of one or more intended receivers, will have a different chaotic function respectively driving the thresholding at the reception comparator and producing the transmitter carrier pulse train. The choice of a chaotic map to drive the thresholding and carrier pulse train production is a matter of design choice for artisans having familiarity with chaotic maps.

Turning now to reception by the receivers 14 and 14a in FIGS. 1a and 1b, their ability to decode data from a received pulse signal depends upon production of a synchronized replica of the carrier chaotic pulse train used in the transmitter 12. This is accomplished with an identically matched chaotic pulse regenerator 18.

When the chaotic pulse regenerator 18 in the receiver 14 is synchronized to the chaotic pulse regenerator 16 in the transmitter 12, decoding a bit of information is accomplished by determining whether a pulse was or was not delayed relative to its anticipated position determined by the synchronized replica chaotic pulse train produced by the receiver chaotic pulse regenerator 18. If ideal synchronization is established, but the signal is corrupted by noise, the optimal detection scheme operates as follows. Integrate the signal over the pulse duration inside the windows where pulses corresponding to "1" and "0" are expected to occur. The decision on whether "1" or "0" is received is made based upon whether the integral over "1"-window is larger or smaller than that over "0"-window. Although in the case of perfect synchronization this detection scheme is ideal, according to numerical simulations conducted by the present inventors, its performance quickly degrades in a chaotic carrier pulse position modulation system according to the invention when synchronization errors due to the channel noise are taken into account.

Figure 5:
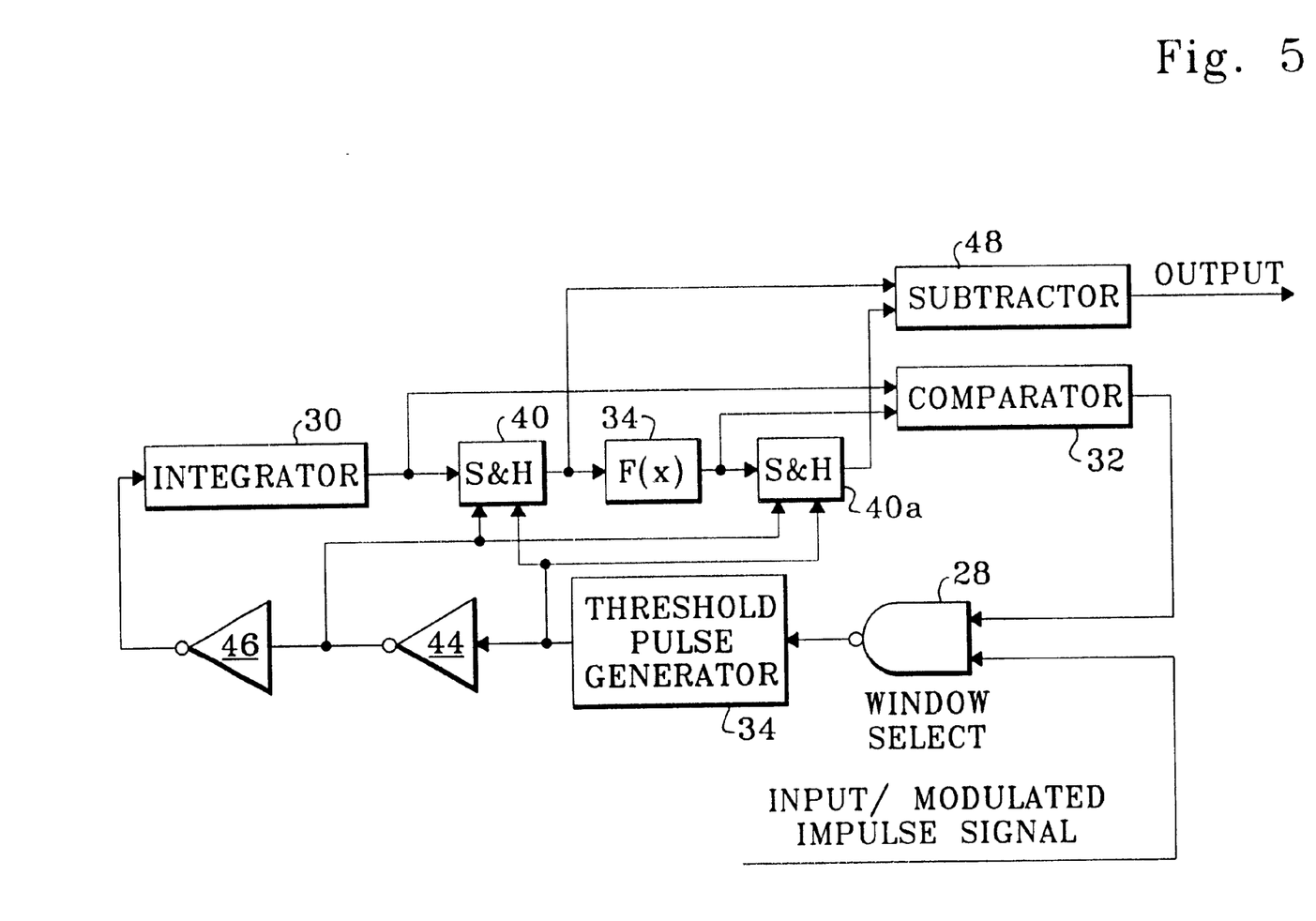
FIG. 5 is a block diagram of a preferred receiver of the invention.

Accordingly, an alternate detection scheme for the receivers 14, 14a is preferred to improve data reproduction performance in the presence of noise. A preferred embodiment receiver 14a is shown in FIG. 5 in which the chaotic pulse regenerator and delay detector have been combined, but the receiver 14a operates consistently with the operational principles of the receiver 14a in FIG. 1b. Elimination of the window control unit turns it into a preferred embodiment receiver 14 operationally consistent with the system of FIG.

1a. The receiver 14a includes many identical components of the transmitter of FIG. 2, and these are labeled with like reference numerals. In the receiver 14a, the integrator 30, identical S&H circuits 40 and 40a and the nonlinear function generator 34 generating the threshold values are reset or triggered by the pulses in the pulse signal received from the transmitter 12 rather than by the pulse from the internal feedback loop. To be more precise, they are triggered when the input pulse signal from the channel exceeds certain input threshold. The time difference between the anticipated location of the pulse without modulation and the actual arrival time translates into the difference between the threshold value generated by the nonlinear function generator 34 and the voltage at the integrator 30 at the moment when the pulse signal exceeds the input threshold. For each received pulse this difference is computed and is used for deciding whether or not the pulse was delayed. If this difference is less than certain reference value set in a subtractor 48, the detected data bit is "0", otherwise it is "1".

The window control unit 28 selectively blocks input of the pulse signal to chaotic pulse regenerator 18. Once the receiver 14a correctly observes two consecutive pulses it can predict the earliest moment of time when it can expect to receive the next pulse. This means that it can block input of the pulse signal until shortly before such a moment. This is done through the window control unit 28. Using such windowing greatly reduces the chance of the receiver 14a being triggered by noise, interference or impulses belonging to other users.

Figure 6:
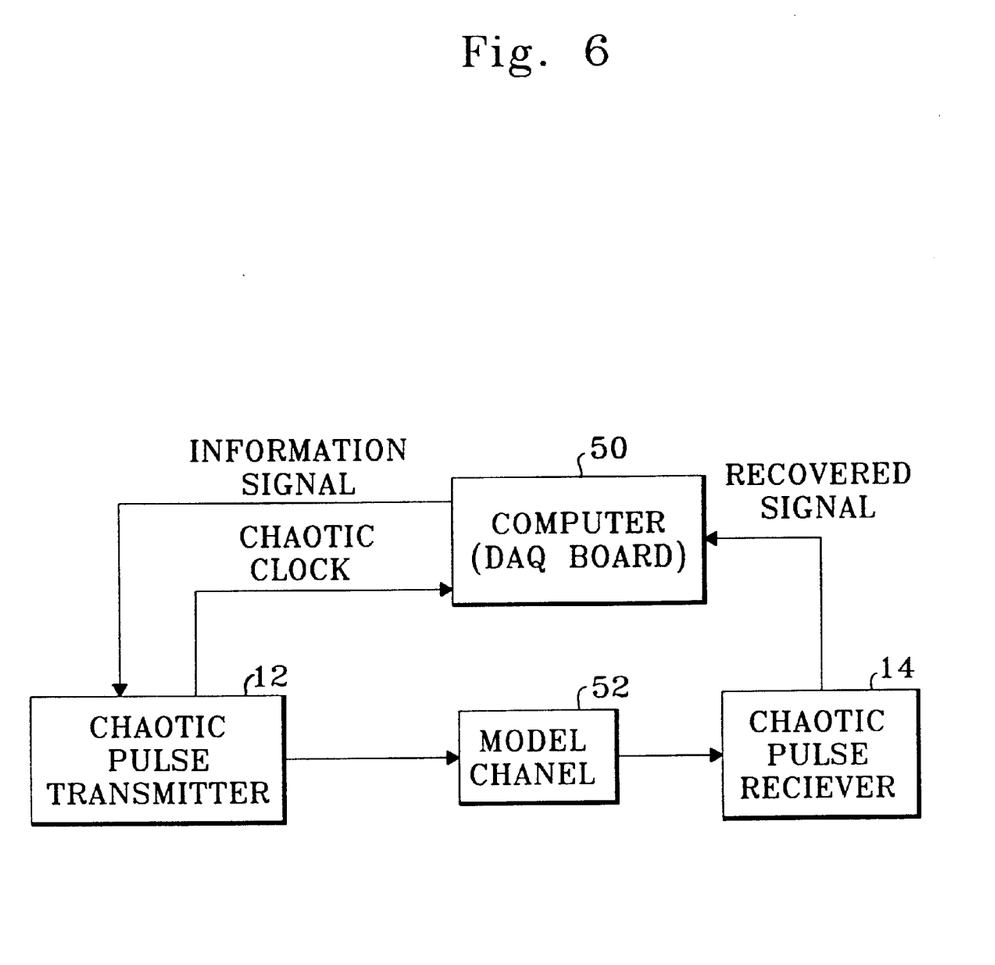

In an experiment conducted by the inventors to test the invention, the experimental setup in FIG. 6 including a computer 50 with a data acquisition board as the data source, triggered by the comparator 32 as shown in FIG. 2. A model communication channel 52 simulated noise and filtering, and a model receiver constructed according to FIG. 6 received and decoded sample pulse signals from the model channel 52. The transmission pulse duration was 500 ns. The distance between the pulses varied between 12 $\mu$s and 25 $\mu$s with the average bit rate being 60 kb/sec. The amplitude of pulse position modulation was 2 $\mu$s. The computer 50 in the model experimental system was also used to record the pulse displacement from the demodulator subtractor 48 for every received pulse. This value was used to decode the information for the bit error rate analysis. The model channel circuit 52 consisted of white Gaussian noise generator and a bandpass filter with the pass band 1 kHz–500 kHz.

Figure 7:
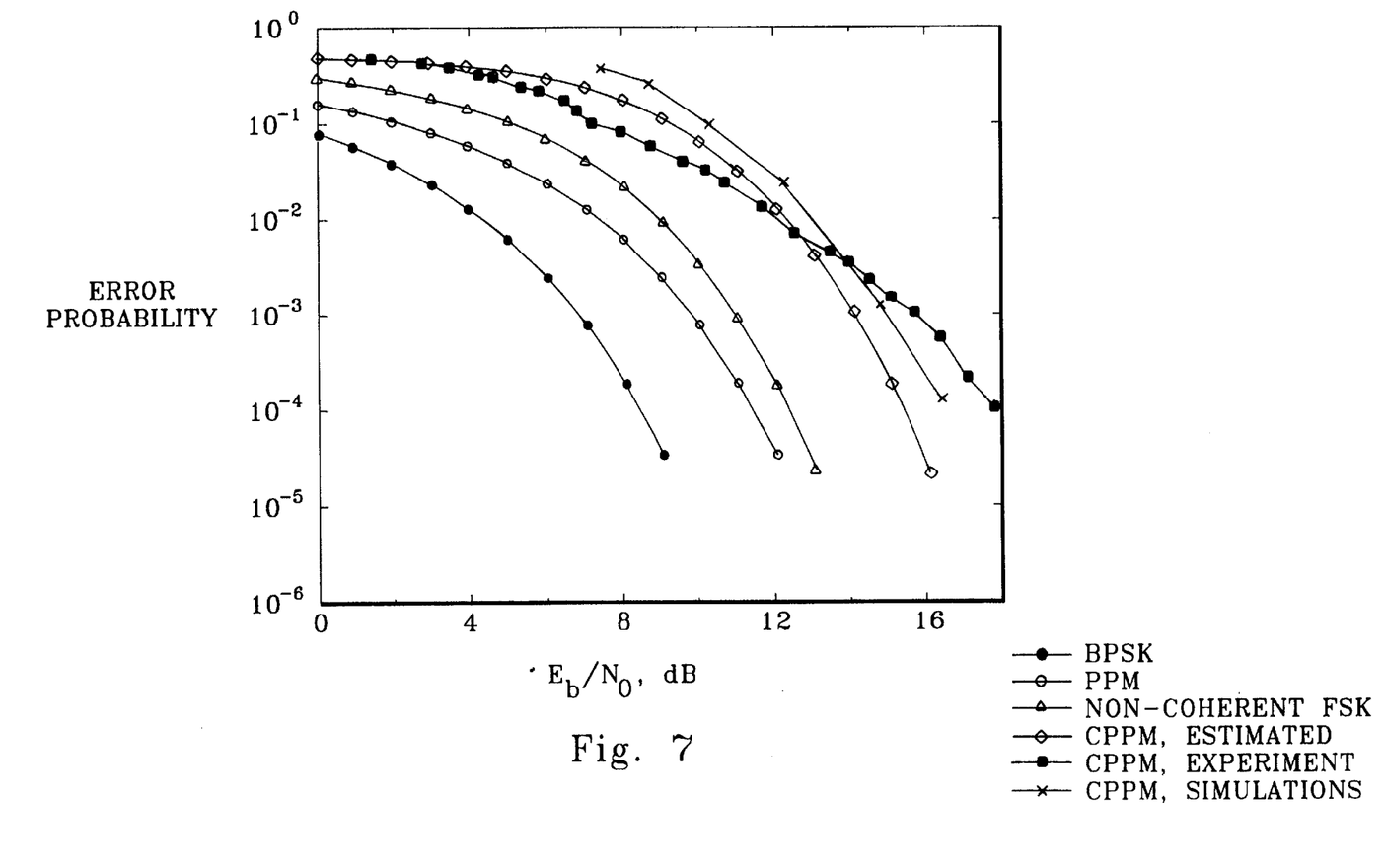
FIG. 7 is a plot of error probabilities comparing the invention to various conventional schemes.

The performance of the model system of the invention constructed according to FIGS. 2 and 5 and shown in FIG. 6 was evaluated by studying the dependence of the bit error rate on the ratio of energy per one transmitted bit to the spectral density of noise, $E_b/N_0$. This dependence is shown in FIG. 7, where it is compared to the performance of more traditional communication schemes, BPSK (binary phase shift keying), PPM (pulse position modulation), and noncoherent FSK (frequency shift keying).

Analytical estimation of the performance of the system of the invention assuming perfect synchronization was also conducted. The corresponding curve is also shown in FIG. 7. The seemingly better performance of the experimental device compared with the analytical estimate is in part due to the crudeness of the analytical model, and in part due to the fact that at high noise level the noise distribution deviates from Gaussian due to hardware limitations in the experimental device. In the region of low noise, the deviation of the experimental performance from the analytical estimate is probably due to the slight parameter mismatch between the transmitter and the receiver.

From the above, artisans will appreciate and understand various advantages of the present invention, as illustrated by the following examples. The wide band chaotic carrier pulse position modulation system and method provides low probability of intercept and low probability of detection compared to earlier proposed chaos-based covert communication schemes. It improves privacy with low complexity. The system of the invention appears to perform exceptionally well compared to conventional chaos-based covert communication schemes. The invention permits a multiplexing strategy. Compared to other impulse systems, the chaotic carrier pulse position modulation of the invention does not rely on a periodic clock, and thus can eliminate any trace of periodicity from the spectrum of the transmitted signal. The invention also provides the low power advantages of conventional impulse communication systems.

While various embodiments of the present invention have been shown and described, it should be understood that other modifications, substitutions and alternatives are apparent to one of ordinary skill in the art. Such modifications, substitutions and alternatives can be made without departing from the spirit and scope of the invention, which should be determined from the appended claims.

Various features of the invention are set forth in the appended claims.

What is claimed is:

1. A communication system comprising:
   a transmitter, said transmitter including
      a transmission chaotic pulse regenerator which generates a carrier pulse train having chaotically variable interpulse intervals;
      a data encoder which encodes data onto said carrier pulse train by selectively altering or not altering an interval between consecutive pulses to produce a pulse signal; and
   a receiver which receives said pulse signal from said transmitter via a communication medium, said receiver including
      a reception chaotic pulse regenerator matched to the transmission pulse regenerator, said reception chaotic pulse regenerator generating a synchronized replica of said carrier pulse train; and
      a data decoder that receives said pulse signal and decodes said data based upon said synchronized replica of said carrier pulse train.

2. The system according to claim 1, wherein said data encoder comprises a delay circuit which delays a pulse in said carrier pulse train to alter an interpulse interval.

3. The system according to claim 1, wherein said data decoder only receives limited portions of said pulse signal in which data is expected.

4. The system according to claim 3, wherein said limited portions are determined by said synchronized replica of said carrier pulse train.

5. The system according to claim 1, wherein said decoder receives said pulse signal, commences an integration function each time the pulse signal exceeds a predetermined threshold and determines whether an interpulse interval has been altered by evaluating the difference between the value of the integration function and a nonlinear function used by said reception chaotic pulse regenerator to generate said synchronized replica of said carrier pulse train.

6. The system according to claim 5, wherein said decoder determines that an interpulse interval has been altered when the difference between the value of the integration function and the nonlinear function at the time coinciding with arrival of a pulse in said pulse signal exceeds a predetermined value.

7. The system according to claim 1, wherein said reception chaotic pulse regenerator receives said pulse signal as input for synchronization to said transmission chaotic pulse regenerator.

8. The system according to claim 7, wherein said data decoder comprises a subtractor and an integrator and said reception chaotic pulse regenerator comprises a nonlinear function generator, said subtractor determining the difference between a threshold value generated by said nonlinear function generator at a moment when the pulse signal exceeds a predetermined threshold to decode said data.

9. The system according to claim 8, wherein said receiver further comprises a window control unit which selectively blocks input of said pulse signal to said reception chaotic pulse regenerator outside windows of time when a pulse is expected in said pulse signal.

10. A method for communicating information comprising the steps of:

generating a pulse train carrier signal having adjacent pulses separated by a chaotically varying time;

pulse position modulating said pulse train carrier signal to produce a pulse signal;

transmitting said pulse signal over a communication medium to a receiver;

in the receiver, generating a synchronized replica of said pulse train carrier signal, and determining the modulation of said pulse train carrier performed in said modulating step based upon said synchronized replica of said pulse train carrier signal.

11. The method according to claim 10, further comprising:

in the receiver, predicting, based upon said synchronized replica of said pulse train carrier and a sample of said pulse signal, expected arrival times for pulses in said pulse signal; and in the receiver, limiting said step of determining the modulation to windows of time corresponding to said expected arrival times for pulses.

12. The method according to claim 10, wherein spacing between adjacent (n−1)-th and n-th pulses in said pulse signal is proportional to a threshold value $x_n$, the threshold value $x_n$ being generated according to a map $x_{n+1}=F(x_n)+s_n$ where $F(x)$ is a nonlinear function and $s_n$ is an information signal.

* * * * *